(12) United States Patent
Gwoziecki et al.

(10) Patent No.: US 8,710,494 B2
(45) Date of Patent: Apr. 29, 2014

(54) ORGANIC DUAL-GATE MEMORY AND METHOD FOR PRODUCING SAME

(75) Inventors: Romain Gwoziecki, Foulain (FR); Mohamed Benwadih, Champigny-sur-Marne (FR); Philippe Coronel, Barraux (FR); Stéphanie Jacob, Saint Siméon de Bressieux (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/500,273

(22) PCT Filed: Sep. 30, 2010

(86) PCT No.: PCT/FR2010/000650
§ 371 (c)(1),
(2), (4) Date: Apr. 24, 2012

(87) PCT Pub. No.: WO2011/042619
PCT Pub. Date: Apr. 14, 2011

(65) Prior Publication Data
US 2012/0199821 A1    Aug. 9, 2012

(30) Foreign Application Priority Data
Oct. 5, 2009 (FR) ...................................... 09 04749

(51) Int. Cl.
*H01L 21/02*    (2006.01)

(52) U.S. Cl.
USPC 257/40; 257/315; 257/E21.495; 257/E21.645; 257/E29.273; 257/E51.025

(58) Field of Classification Search
USPC ................... 257/40, 147, 315, E21.495, 645, 257/29.273, 51.025, 27; 438/99
See application file for complete search history.

(56) References Cited

U.S. PATENT DOCUMENTS

| | | | |
|---|---|---|---|
| 6,335,539 B1 * | 1/2002 | Dimitrakopoulos et al. ... | 257/40 |
| 6,518,103 B1 * | 2/2003 | Lai ................................ | 438/150 |
| 7,042,755 B1 * | 5/2006 | Bocian et al. ................ | 365/151 |
| 7,635,859 B2 * | 12/2009 | Lee et al. ...................... | 257/40 |

(Continued)

FOREIGN PATENT DOCUMENTS

EP    1 367 659 A2    12/2003

OTHER PUBLICATIONS

Zilker, S. J. et al., "Bias stress in organic thin-film transistors and logic gates," *Applied Physics Letters*, American Institute of Physics, vol. 79, No. 8, Aug. 20, 2001, pp. 1124-1126.

(Continued)

*Primary Examiner* — Michael Lebentritt
(74) *Attorney, Agent, or Firm* — Oliff PLC

(57) ABSTRACT

The organic memory device is a double-gate transistor that successively comprises a first gate electrode, a first gate dielectric, an organic semi-conductor material, a second gate dielectric and a second gate electrode. Source and drain electrodes are arranged in the organic semiconductor material and define an inter-electrode surface. A trapping area is arranged between the organic semiconductor material and one of the gate electrodes and is in electric contact with one of the gate electrodes or the organic semi-conductor material. The trapping area is at least facing the inter-electrode surface.

13 Claims, 7 Drawing Sheets

(56) References Cited

U.S. PATENT DOCUMENTS

| | | | |
|---|---|---|---|
| 2003/0218166 A1* | 11/2003 | Tsutsui | 257/40 |
| 2005/0205969 A1* | 9/2005 | Ono et al. | 257/645 |
| 2007/0164272 A1* | 7/2007 | Yang et al. | 257/40 |
| 2008/0099756 A1* | 5/2008 | Klauk et al. | 257/40 |
| 2009/0101962 A1* | 4/2009 | Hong et al. | 257/322 |
| 2009/0146202 A1* | 6/2009 | Leong et al. | 257/315 |
| 2009/0194762 A1* | 8/2009 | Kloc et al. | 257/40 |
| 2010/0297808 A1* | 11/2010 | Lee et al. | 438/99 |
| 2013/0181192 A1* | 7/2013 | Hwang et al. | 257/40 |

OTHER PUBLICATIONS

Lloyd-Hughes, J. et al., "Polymer Transistor Performance Monitored by Terahertz Spectroscopy," *Sources, Detectors and Receivers Semiconductor, Superconductor and Other*, 2006, pp. 203.

Facchetti, Antonio et al., "Interfacial Phenomena Affecting Charge Transport in Small Molecule Organic Thin-Film Transistors," *Materials Research Society Symposium Proceedings*, vol. 965, 2007, pp. 258-263.

Cui, Tianhong et al., "Dual-gate pentacene organic field-effect transistors based on a nanoassembled $SiO_2$ nanoparticle thin film as the gate dielectric layer," *Applied Physics Letters*, American Institute of Physics, vol. 86, 2005, pp. 064102.1-064102.3.

Feb. 1, 2010 French Search Report issued in Patent Application No. 0904749 (with translation).

"Organic Chemistry—Wikipedia, The Free Encyclopedia," XP055095446, excerpt from website: URL:http://en.wikipedia.org/wiki/Organic_chemistry, retrieved Jan. 9, 2014.

Jan. 15, 2014 Office Action issued in European Application No. 10 776 760.0 with English-language translation.

* cited by examiner

ORGANIC DUAL-GATE MEMORY AND METHOD FOR PRODUCING SAME

BACKGROUND OF THE INVENTION

The invention relates to a memory device comprising a first gate electrode, a first gate dielectric, an organic semiconductor material, and source and drain electrodes defining an inter-electrode surface.

The invention also relates to a method for producing an organic memory device.

STATE OF THE ART

Organic electronics has become a major research field. Most of the elementary devices known in silicon electronics are being achieved or are already achieved by means of organic electronics.

However, the materials being different, the physical phenomena involved are also different and certain technological blocks are difficult to transpose. This is in particular the case of memory cells made from organic materials. It is currently difficult to produce organic memories which are easy to implement and which present sufficiently good electric characteristics to be able to find everyday applications.

As illustrated in FIG. 1, in conventional manner, the organic memory device is formed from a transistor. The memory device comprises, on a substrate 1, an organic semiconductor material 2 covered by a layer of ferroelectric material 3 and a gate electrode 4. Source and drain electrodes 5 are arranged in contact with organic semiconductor material 2 and define the channel of the transistor. Ferroelectric material 3 simultaneously performs the function of gate insulator and of data retaining area.

These memory devices do not have very good performances as they do not enable good data storage properties and good electric performances of the transistor, generally associated with a good conduction in the channel, to be combined. These devices therefore present data loss problems when reading the stored state.

OBJECT OF THE INVENTION

The object of the invention is to provide a memory device that is easy to implement and that presents high electric performances, in particular in read speed and storage reliability.

It is a further object of the invention to provide a method for producing the memory device that is easy to implement and that comprises a small number of technological steps, for example by printing techniques.

The device according to the invention is characterized in that the memory device being a double-gate transistor arranged on each side of the organic semiconductor material, the device comprises a second gate dielectric, a second gate electrode, and an electric charge trapping area arranged between the organic semiconductor material and one of the gate electrodes, said trapping area being in electric contact with one of the gate electrodes or with the organic semiconductor material, said area being at least facing the inter-electrode surface.

The method according to the invention is characterized in that it successively comprises:
   formation of a first gate electrode,
   formation of a first gate dielectric,
   formation of the source and drain electrodes in contact with an organic semiconductor material, the source and drain electrodes defining an inter-electrode surface,
   formation of a second gate dielectric,
   formation of a second gate electrode,
and in that it comprises formation of an electric charge trapping area between the organic semiconductor material and one of the gate electrodes, the trapping area being in electric contact with one of the gate electrodes or with the organic semiconductor material, the trapping area being at least facing the inter-electrode surface.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PREFERRED EMBODIMENTS OF THE INVENTION

Figure 1:
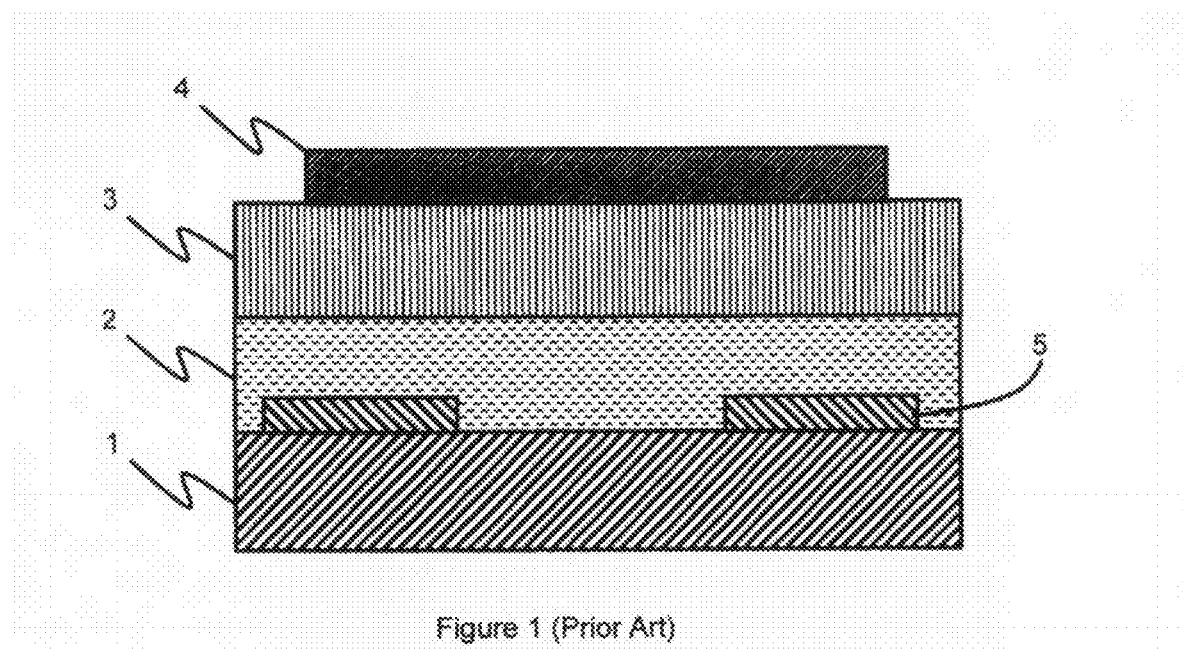
FIG. 1 represents a memory device according to the prior art, in schematic manner in cross-section.
Figure 2:
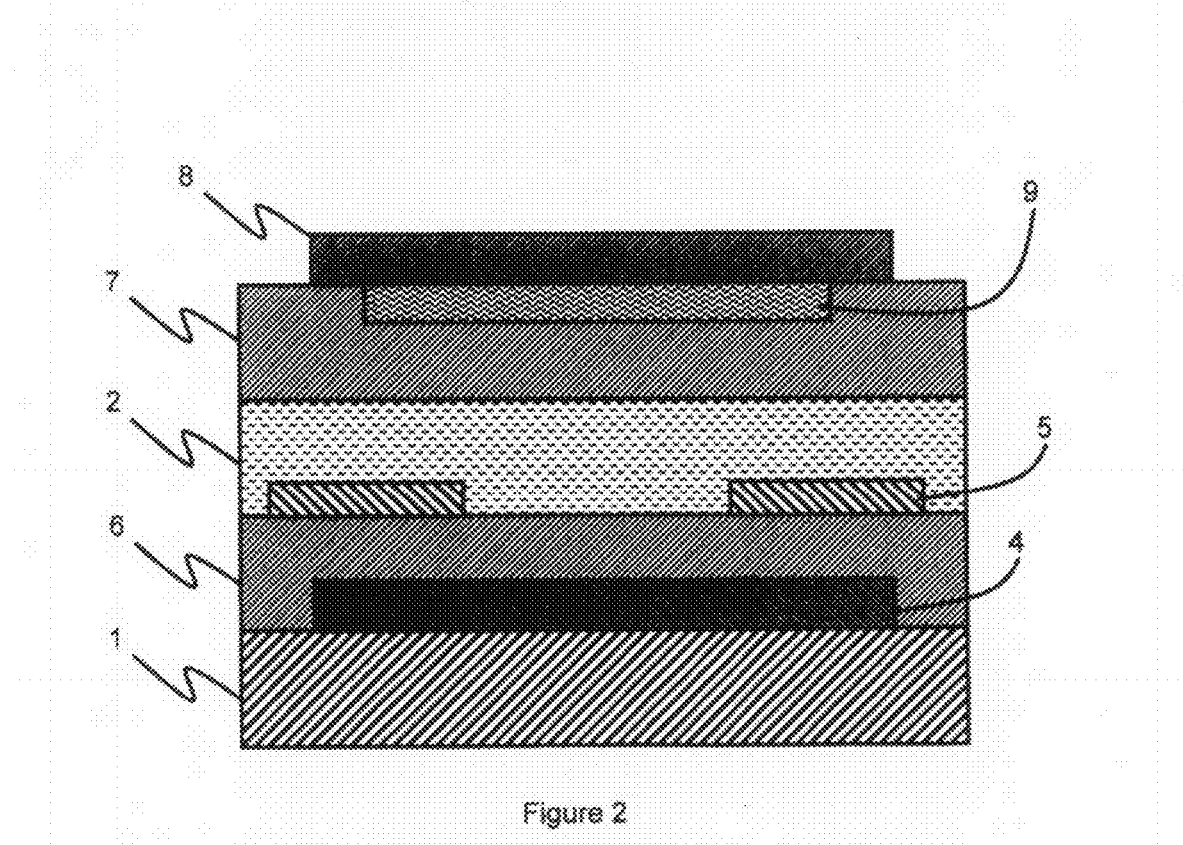
FIGS. 2 to 11 represent different embodiments of a device according to the invention, in schematic manner in cross-section.

The memory device is formed from a double-gate organic transistor, i.e. a transistor having two gates arranged on each side of the channel. The channel of the transistor is formed from an organic semiconductor material 2. The semiconductor can be in the form of a single layer or in the form of a stack of layers made from different materials. As illustrated in FIG. 2, the organic memory device successively comprises a first gate electrode 4, a first gate dielectric 6, an organic semiconductor material 2, a second gate dielectric 7 and a second gate electrode 8. The two gate electrodes are therefore arranged on each side of the organic semiconductor material.

Figure 3:
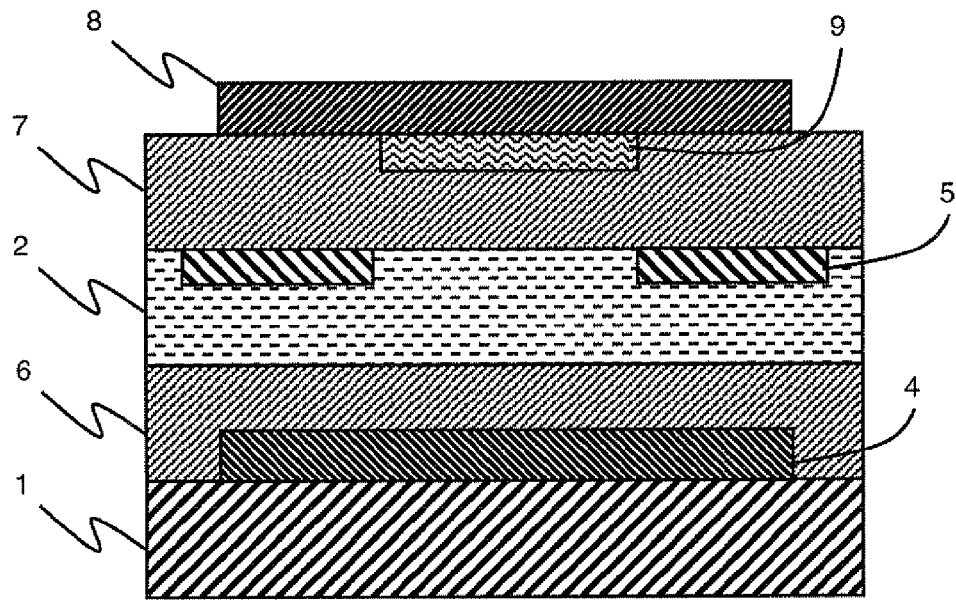
Figure 4:
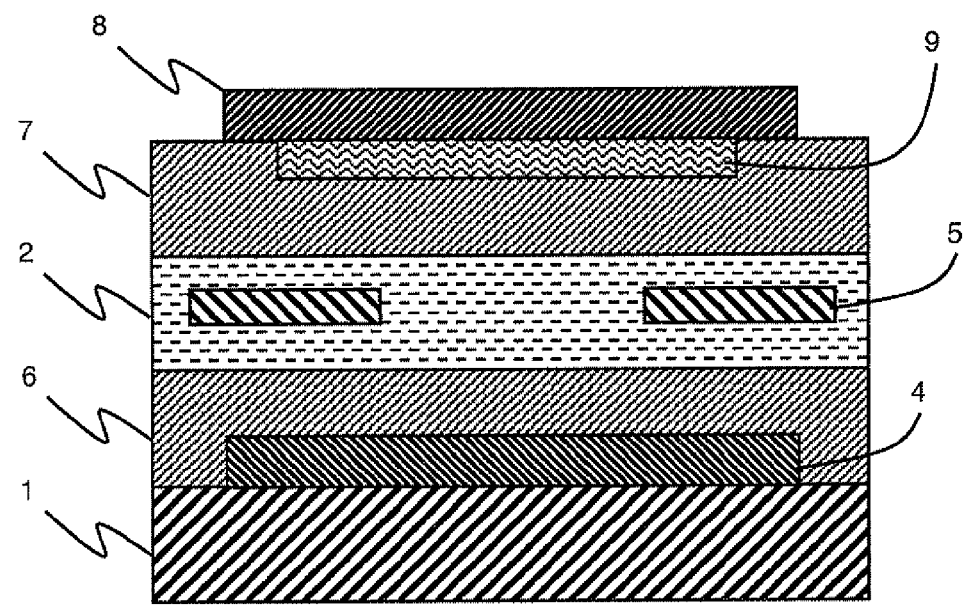

The memory device also comprises source and drain electrodes 5 arranged between first and second gate dielectrics 6 and 7. Source and drain electrodes 5 define an inter-electrode surface 2a, also called active surface, in semiconductor material 2. Inter-electrode surface 2a corresponds to the intersection of the surface of semiconductor material 2 with the surface delineated by the ends of the source and drain electrodes. In most cases, inter-electrode surface 2a thus comprises the area immediately comprised between source and drain electrodes 5, but also the surface of source and drain electrodes 5 that are deposited or that are covered by semiconductor material 2. Inter-electrode surface 2a schematically comprises the surface delineated by source and drain electrodes 5 and that can be assimilated to the channel and the surface of each of source and drain electrodes 5 in so far as they are covered by or cover semiconductor material 2. The surface assimilated to the channel corresponds to the surface which most of the charge carriers follow between source and drain electrodes 5. As illustrated in FIGS. 2 and 3, these source and drain electrodes 5 can be arranged in contact with first gate dielectric 6 or second gate dielectric 7. Source and drain electrodes 5 can also be coated by organic semiconductor material 2 (FIG. 4), i.e. comprised vertically between two portions of organic semi-conductor material 2. Source and drain electrodes 5 are substantially located in a plane parallel to the interface between first gate dielectric 6 and organic semiconductor material 2.

Figure 5:
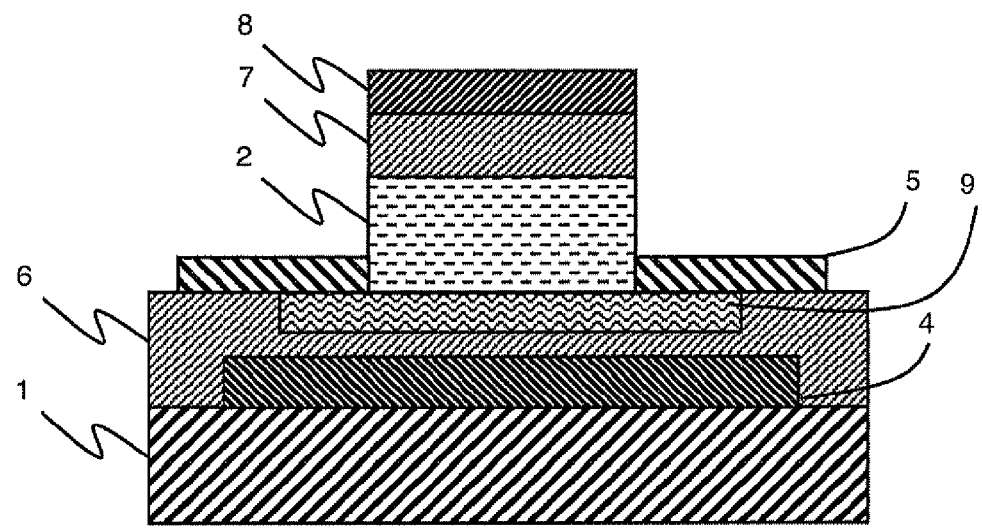
Figure 6:
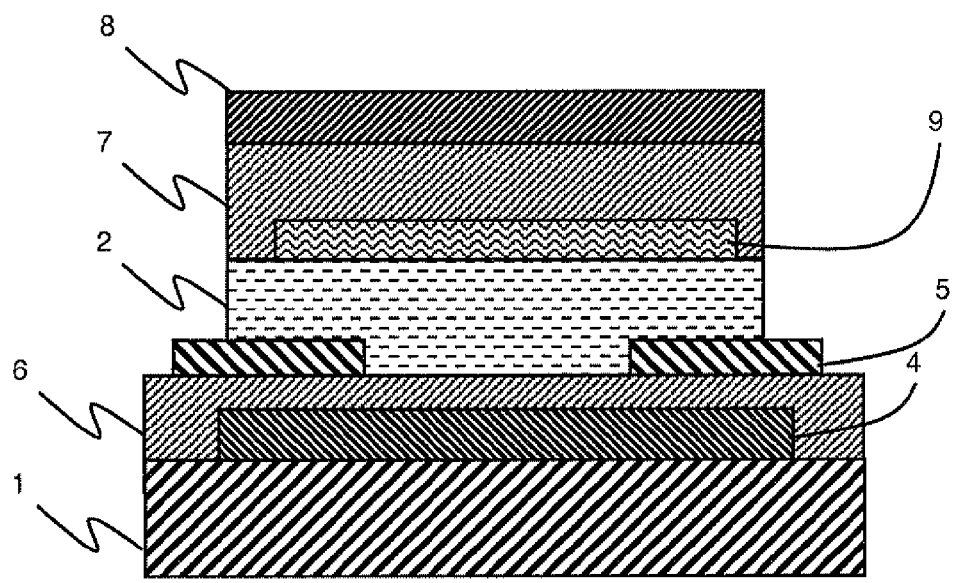

Source and drain electrodes 5 are in electric contact with organic semi-conductor material 2. As illustrated in FIG. 5, electrodes 5 can be arranged on each side of semiconductor material 2, or semiconductor material 2 can partially or completely cover source and drain electrodes 5 (FIGS. 6 and 2).

The memory device also comprises a trapping area 9 of the electric charges. This charge trapping area 9 is located facing inter-electrode area 2a. The surface of trapping area 9 can be broke n down (FIGS. 2 and 3). The trapping area can be larger than the area situated between the electrodes so that the trapping area can be partially or totally facing one of the electrodes. The larger the facing surface between trapping area 9 and inter-electrode area 2a, the greater the effect of the trapping area on the conduction characteristics of the electric charges of the channel, for a constant charge density in trapping area 9.

Trapping area 9 is arranged between organic semiconductor material 2 and one of gate electrodes 4 and 8. Trapping area 9 is in electric contact with gate electrode 4, 8 or with organic semiconductor material 2. Trapping area 9 can thus be in direct contact with gate electrode 4, 8 or with organic semiconductor material 2. It is also possible for the trapping area to be separated from the gate electrode or from the organic semiconductor material by at least one electrically conductive material. Charges can thus be injected from gate electrode 4, 8 or from the channel of the transistor to charge trapping area 9.

In a particular embodiment, trapping area 9 is arranged between one of gate dielectrics 6 or 7 and associated gate electrode 4 or 8 (FIGS. 2, 3, 4, 7 and 8). In this case, the material constituting trapping area 9 is formed before first gate dielectric 6 or after second gate dielectric 7. It is also possible to pattern the gate electrode to incorporate the charge trapping material in the gate electrode architecture. The charge trapping material is then advantageously an ionic conducting polymer material, for example an ionomer composed of a hydrophobic skeleton of poly(tetrafluoroethylene) (PTFE) type on which perfluorinated (perfluorovinylether) dangling chains terminated by sulfonic groups are grafted, a product marketed by DuPont under the brand name nafion®.

In the case of FIG. 3 for example, trapping area 9 can also be formed by decomposition of a specifically deposited semiconductor material. However, it can also be envisaged to form trapping area 9 by decomposition of an area of the gate dielectric. The decomposed portion of gate dielectric 6 or 7 then presents different electric characteristics from the rest of the material. The decomposed gate dielectric presents a higher surface state density and it can significantly keep the accumulated charges. Localized decomposition of the gate dielectric can be performed for example by physical, chemical, laser or plasma treatment.

To achieve definition of a high state and a low state, a notable shift of the threshold voltages has to be created. This shift is proportional to the trapped state density to be created and inversely proportional to the electric capacity of the insulating material situated at the interface where the trapped states are created. The relation giving the shift is the following:

$$\Delta = e \cdot \frac{N_{SS}}{C_{OX}}$$

with e the electron charge, $N_{SS}$ the trapped state density and $C_{OX}$ the dielectric capacity.

For example purposes, for a dielectric material with a thickness of 800 nm having a relative dielectric constant of 2, an interface state density equal to $6.9*10^{10}/cm^2$ enables a shift of about 5V. For a dielectric material with a thickness of 100 nm having a relative dielectric constant of 2, an interface state density equal to $1.1*10^{11}/cm^2$ enables a shift of about 1V.

In advantageous manner, the state density is greater than $10^9/cm^2$ and preferably less than $10^{12}/cm^2$.

An advantageous embodiment of decomposition o f the required material uses excimer laser radiation with pulses ranging from a few nanoseconds to a few tens of nanoseconds, preferably between 10 and 20 ns. The wave-length is comprised in the ultraviolet range, for example a wavelength of 248 nm or 385 nm. The energy delivered by laser pulse depends on the irradiated material. In the case of a polymer substrate, the pulse energy is advantageously comprised between 20 mJ/cm² and 200 mJ/cm². This energy enables a significant number of interface states to be created which are linked to breaking of C—H bonds within the polymer and to creation of C—OH bonds (hydroxyls) or C—OOH bonds (acids) at the interface. Laser irradiation can be performed in different atmospheres, for example in an atmosphere comprising oxygen. Ultraviolet radiation is particularly interesting in association with a substrate of polymer type as the absorption is high.

In another embodiment, trapping area 9 is arranged between gate dielectric 6, 7 and semiconductor material 2. Trapping area 9 is then formed by a trapping material which has different electric characteristics from the materials forming gate dielectric 6, 7 and semiconductor material 2. It is also possible to form the trapping area by means of an interface comprising a large surface state density. This interface can be formed by decomposing the gate dielectric and/or semiconductor material. Decomposition of the surface can be performed by physical, chemical, laser or plasma treatment. Decomposition is performed on an atomic monolayer or advantageously on several atomic layers typically over a depth of a few nanometers.

In general manner, charge trapping area 9 is an area that is able to keep the charges that have been incorporated for a certain length of time. The trapped charges will create polarization of trapping area 9. Trapping area 9 then induces a modification of the electric characteristics of the device in capacitive manner. It therefore becomes possible to define at least two states in the memory cell, a high state and a low state.

In general manner, the material forming trapping area 9 can be an ionic conductive polymer material, a polymer material that is charged with trapping particles, for example metallic or ferroelectric particles. The material of the trapping area can also be a dielectric or semiconductor material comprising a high surface state density. In certain cases, the material of the charge trapping area can be formed by the decomposed organic semiconductor material, or from one of the gate dielectrics that is also decomposed.

Figure 9:
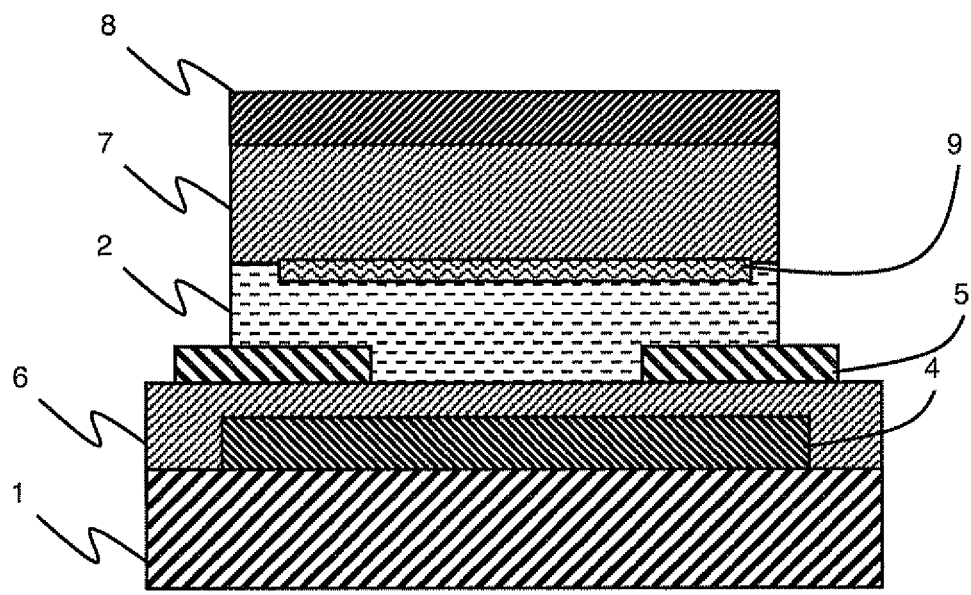

In the case where charge trapping area 9 is arranged in electric contact with organic semiconductor material 2, it is advantageous to form the trapping area by decomposition of the first gate dielectric (FIG. 5) or of the organic semiconductor material (FIG. 9).

In the case where charge trapping area 9 is arranged in electric contact with a gate electrode 4, 8, it is advantageous to use a trapping area made from ionic conducting polymer material.

Figure 10:
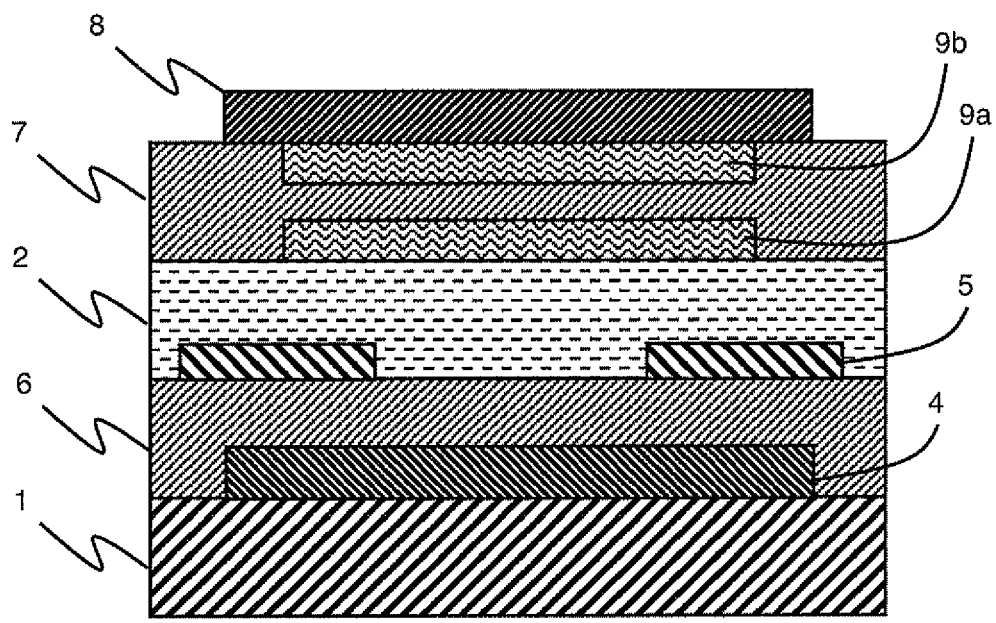

In an alternative embodiment illustrated in FIG. 10, the memory device comprises a charge trapping area 9 formed by two elementary trapping areas 9a and 9b. These two elementary trapping areas are arranged above one another and separated by the gate dielectric. First elementary trapping area 9a is in contact with organic semiconductor material 2 whereas second elementary charge trapping area 9b is in contact with a gate electrode 4, 8. Each elementary trapping area 9a and 9b meets the same criteria as trapping areas 9 of the previous embodiments. In the case where elementary trapping areas 9a and 9b are superposed, the capacitive effect is higher enabling a lower charge voltage to be had. In the case where elementary trapping areas 9a and 9b are on the same plane, it is then possible to form a memory of multibit type, i.e. that is able to store several bits, here for example two storage areas of one bit.

Figure 11:
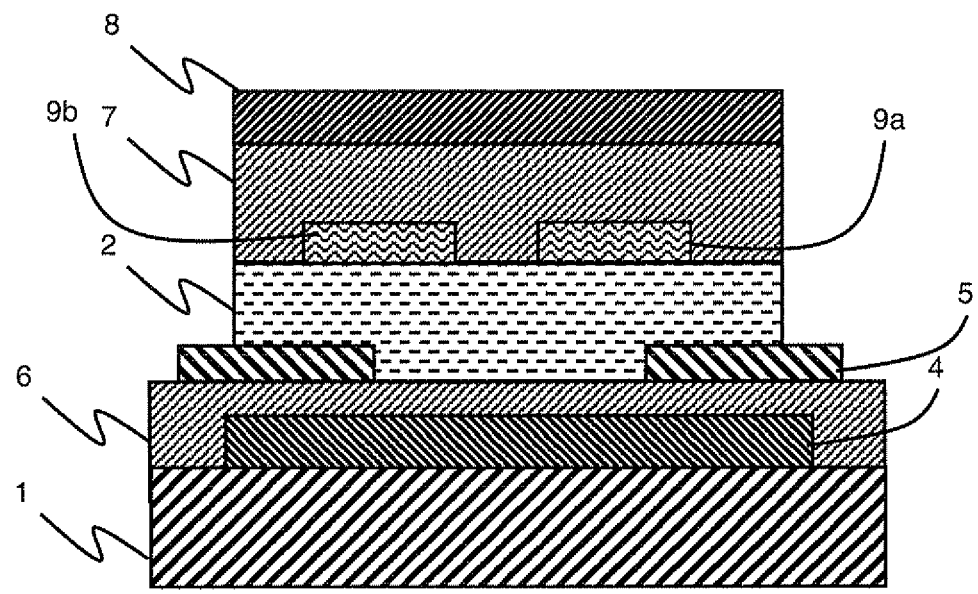
Figure 12:
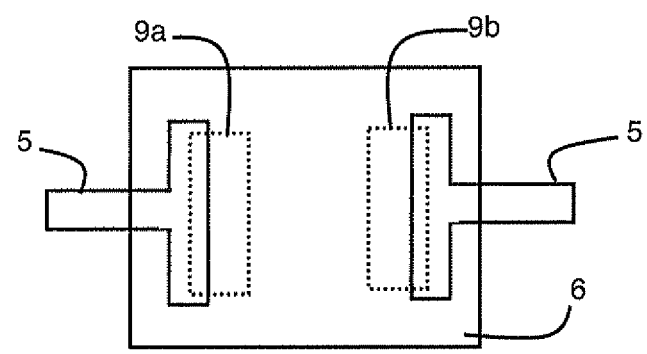
FIG. 12 represents an embodiment of a multibit device according to the invention, in schematic manner in top view.

In another alternative embodiment illustrated in FIG. 11, the memory device comprises a charge trapping area formed by at least two elementary trapping areas 9a and 9b. These two elementary trapping areas are arranged side by side in the same plane parallel to the surface of substrate 1. The different elementary trapping areas are all in contact with organic semiconductor material 2 or with one of the gate electrodes. The elementary trapping areas form lines parallel to source and drain electrodes 5 separated by the gate dielectric, i.e. perpendicular to the direction of movement of the carriers in the channel and therefore to the smallest distance separating the two electrodes. An example embodiment is illustrated in FIG. 12 in which the two elementary trapping areas 9a and 9b are formed. These two trapping areas are formed on bottom gate 6 before deposition of the first gate dielectric and source and drain electrodes 5. Advantageously, source and drain electrodes 5 are at least partially formed above elementary trapping areas 9a and 9b, the trapping areas having smaller dimensions than the electrodes in the direction perpendicular to movement of the carriers. This structure enables a multibit memory to be obtained. In the embodiment of FIG. 12, the bottom gate is not represented, there is successively formation of trapping areas 9a and 9b, of bottom dielectric 6 and then of source and drain electrodes 5. The semiconductor material, top dielectric and top gate are subsequently formed as in the embodiment illustrated in FIG. 4.

Trapping area 9 is arranged on a single side of the memory device with respect to semiconductor material 2. The trapping area is therefore formed between semiconductor material 2 and the gate electrode associated with the trapping area. The associated electrode is the gate electrode which is used to perform data write. The other gate electrode is used for data read.

If trapping area 9 is in contact with the write gate electrode, modulation of the gate electrode potential enables the data to be written or deleted in the trapping area.

If trapping area 9 is in contact with semiconductor material 2, a current has to be made to transit between source and drain electrodes 5 and an electric field has to be applied such that, in the channel, the charge carriers are directed to the charge trapping area. Schematically, if an electron current flows between the source electrode and drain electrode, the write gate electrode has a more positive potential than that of the channel so as to attract the electrons to the trapping area arranged between the electron current and the write gate.

The electric charge carriers that are trapped in trapping area 9 will modify the characteristics of the single-gate transistor that is formed by the read gate and source and drain electrodes 5 arranged on each side of the channel, by capacitive effect. If the trapping area is arranged facing what is assimilated to the channel, the accumulated charges will modify the conduction in the channel. If the trapping area is arranged facing the semiconductor material arranged above or below one of the source and drain electrodes, the injection resistance of the electrode is modified.

This memory device architecture is particularly advantageous as there is no use of the write gate electrode to perform data read. The memory device is therefore particularly robust to resist read disturb phenomena in which the data is more or less deleted or impaired at each read.

In this organic memory device, the charges of trapping area 9 originate from the gate electrode or from the channel of the transistor by conduction and not by tunnel effect as tunnel effect is difficult to apply in the thick layers of the printing technologies used in this field.

In general manner, the memory device is formed by means of the following fabrication method which comprises:
formation of first gate electrode 4,
formation of first gate dielectric 6,
formation of source and drain electrodes 5 in contact with organic semi-conductor material 2, source and drain electrodes 5 defining an inter-electrode surface,
formation of second gate dielectric 7,
formation of second gate electrode 8.

With regard to the different possible embodiments, it is also necessary for there to be formation of electric charge trapping area 9 between organic semiconductor material 2 and one of gate electrodes 4, 8. As stipulated in the foregoing, it is also necessary for trapping area 9 to be in electric contact with one of gate electrodes 4, 8 or with organic semiconductor material 2. Likewise, trapping area 9 must be at least facing the inter-electrode electrode surface so as to have a capacitive effect which acts on operation of the transistor formed with the read gate.

In slightly more detailed manner, the memory device can be fabricated in the following manner from any substrate 1 made from non-conducting material to prevent short-circuiting between the different devices. Substrate 1 is for example a glass, polyimide, polyethylene terephtalate or polyethylene naphtalate substrate.

A first gate electrode 4 is formed on substrate 1 in conventional manner. This first gate electrode 4 is for example made from metallic material, for example gold with a thickness comprised between 30 and 100 nm, or from a conducting polymer such as a mixture of sodium poly(styrene-sulfonate) referred to as "PSS" and of poly(3,4-ethylene-dioxythiophene) called "PEDOT" or from a metallic particle-based ink. First gate electrode 4 can be formed by screen printing or by deposition followed by a photolithography and etching step. Patterning of first gate electrode 4 can also be performed by laser ablation through a mask or by photolithography.

Figure 7:
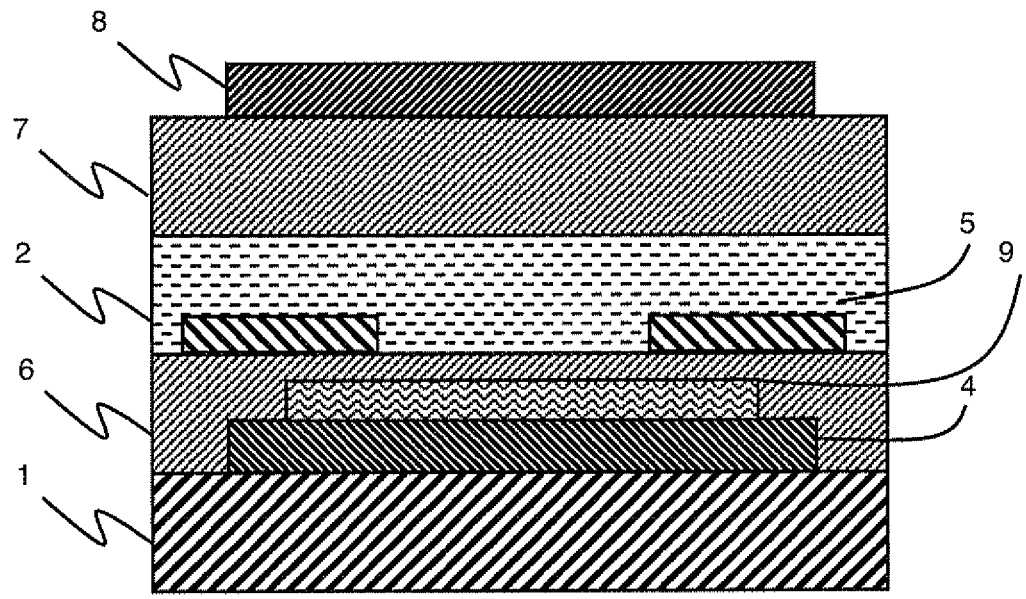
Figure 8:
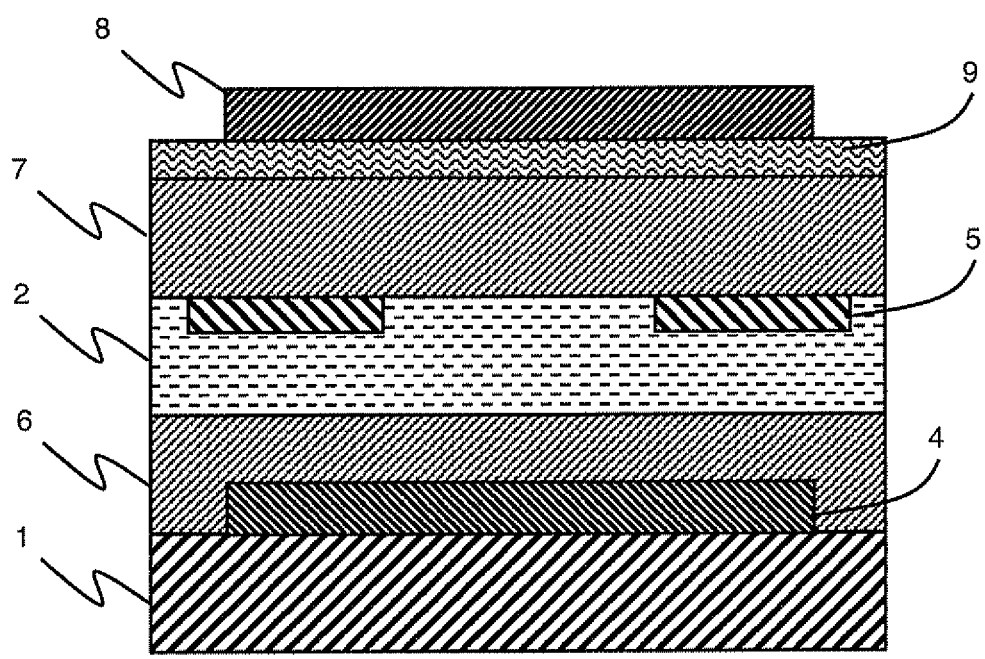

In a particular embodiment illustrated in FIG. 7, the trapping material of trapping area 9 is deposited on first gate electrode 4. This trapping material can be deposited in selective manner in order to form trapping area 9 only. The trapping material can also be deposited in "full wafer" manner and be patterned to delineate trapping area 9. Trapping area 9 can be formed for example by screen printing or by deposition followed by a photolithography and etching step.

First gate dielectric 6 is then deposited on substrate 1 above first gate electrode 4. First gate dielectric 6 is an insulating material, for example a silicon oxide or a cross-linkable polymer, advantageously cross-linkable under ultraviolet radiation. First gate dielectric 6 can be deposited by liquid method and then hardened, for example by means of ultraviolet radiation. The use of an exposure mask associated with the ultraviolet radiation is advantageous to define the areas in which first gate dielectric 6 is to be kept. Patterning of first gate dielectric 6 defines the shape and size of first gate dielectric 6 and also defines the areas which allow contact to be made for first gate electrode 4.

Source and drain electrodes 5 are then formed on first gate dielectric 6, these source and drain electrodes 5 being made from electrically conducting material chosen from the same group of materials as that of first gate electrode 4. Source and drain electrodes 5 are formed by screen printing or by a deposition step followed by a photolithography and etching step. Source and drain electrodes 5 are advantageously formed by evaporation followed by patterning, for example by laser ablation.

In a particular embodiment illustrated in FIG. 5, trapping area 9 is arranged under the channel between semiconductor material 2 and first dielectric material 6. In this particular embodiment, it is particularly advantageous to form trapping area 9 at the same time as source and drain electrodes 5 are patterned. In this particular embodiment, the charge trapping material is advantageously formed in first gate dielectric 6 by decomposing the latter. This decomposition can be performed by the laser radiation that is used to pattern source and drain electrodes 5. Formation of source and drain electrodes 5 and formation of trapping area 9 are thus achieved simultaneously with the same laser radiation.

In the case where source and drain electrodes 5 are arranged above organic semiconductor material 2, i.e. between organic semiconductor material 2 and second gate dielectric 7, it is also advantageous to use patterning of source and drain electrodes 5 to form trapping area 9. Trapping area 9 is then formed in organic semiconductor material 2 by decomposition. As previously, decomposition c an be achieved by laser radiation or by heat treatment, typically etching.

Organic semiconductor material 2 is then deposited on substrate 1, on first gate dielectric 2 and on source and drain electrodes 5. Organic semi-conductor material 2 is for example an amorphous polymer material such as poly tri-arylamine (PTAA) or poly(9,9-dialkylfluorene-alt-triarylamine) (TFB) or a material in small crystallized molecules such as poly(3-hexyl)thiophene (P3HT) or poly(quater-thiophene) (PQT). When semiconductor material 2 is deposited by liquid means, semiconductor material 2 is advantageously associated with a solvent that does not decompose the layers that have already been formed. Semiconductor material 2 is for example associated with a solvent of toluene type. Semiconductor material 2 is typically a pentacene derivative, for example a triisopropylsilyl pentacene (TIPS-pentacene), which is soluble in toluene or xylene.

Second gate dielectric 7 is deposited on organic semiconductor material 2. This second gate dielectric 7 can be deposited by any suitable technique, in particular by liquid means in a solvent that has no effect on organic semi-conductor material 2. It is advantageous to use a fluorinated solvent, for example Cytop™ (brand name for poly fluoro butenyl vinyl ether marketed by ASHAI GLASS). Second gate dielectric 7 is shaped for example by evaporation of the solvent, typically by annealing. Second gate dielectric 7 can be made from the same material as first gate dielectric 6 or from a different material.

In another embodiment illustrated in FIG. 2, trapping area 9 is formed between second gate dielectric 7 and second gate electrode 8. The trapping material is formed in second gate dielectric 7 or above second gate dielectric 7. The material is for example a liquid or solid ionic electrolyte such as nafion® deposited in localized manner above second gate dielectric 7 by liquid method. Localized deposition by liquid method is typically performed by inkjet, by screen printing or by heliography in a polar solvent which is for example ethanol or water. The use of a polar solvent is advantageous, as the polar solvent does not have any effect on second gate dielectric 7 which is typically sensitive to a fluorinated solvent.

Second gate electrode 8 is formed on second gate dielectric 7 or on second dielectric 7 and trapping area 9. Formation of second gate electrode 8 is performed in conventional manner, for example by a printing method or by evaporation. The material of second gate electrode 8 is chosen from the same materials as first gate electrode 4. First and second gate electrodes 4 and 8 can be made from identical materials or they can be made from different materials.

For example purposes, the distance separating source or drain electrodes 5 is less than 100 micrometers, typically between 5 and 100 micrometers. Gate electrodes 4 and 8 have a length of less than 100 micrometers, typically between 5 and 100 micrometers. It is not necessary for the two gates to have the same dimensions. The thickness of first gate dielectric 6 and second gate dielectric 7 is smaller than 5 micrometers, typically between 100 nanometers and 1 micrometer. The thicknesses of the two gate dielectrics 6 and 7 can be different. The thickness of organic semiconductor material 2 is smaller than 1 micrometer, typically the thickness is comprised between 50 nanometers and 200 nanometers. A thickness of more than 50 nanometers enables a transistor that presents good charge conduction performances to be obtained, whereas a thickness of less than 200 nm allows sufficient coupling between the two gate electrodes 4 and 8 to be able to be used as memory device. The dimensions of the memory are given for indicative purposes only and can be smaller than those presented depending on the electric performances presented by the different materials used.

This device can be implemented by printing techniques called "large surface" techniques which is particularly advantageous to produce a large number of components on a single substrate.

In yet another alternative embodiment, it can also be envisaged to combine a layer of nafion with decomposition of the gate dielectric to form a single trapping area enabling the trapping effect to be enhanced.

Figure 13:
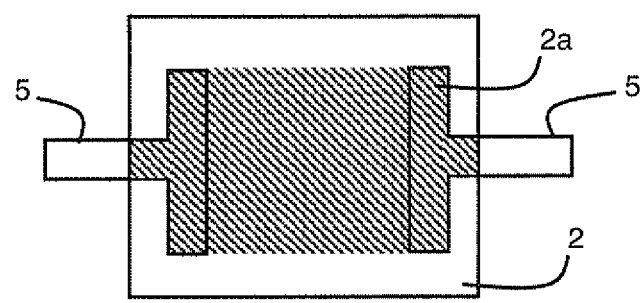
FIGS. 13 and 14 represent arrangements of the semiconductor material and of the source and drain electrodes according to the invention, in schematic manner in top view.
Figure 14:
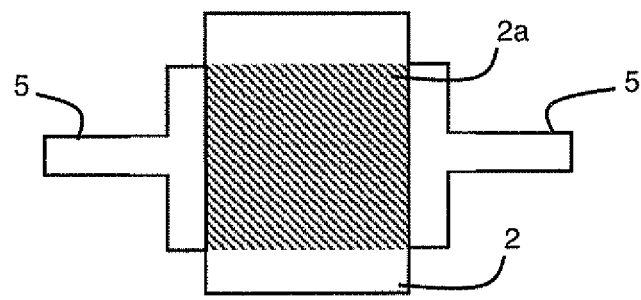

FIGS. 13 and 14 illustrate the extent of the inter-electrode surface according to different embodiments, in schematic manner in top view. In FIGS. 13 and 14, only semiconductor material 2 and source and drain electrodes 5 are represented. In FIG. 13, semiconductor material 2 covers or is covered by source and drain electrodes 5. Under these conditions, inter-electrode surface 2a (represented in hatched lines) comprises the contact surface between electrodes 5 and semiconductor material 2 and the surface of the area of semiconductor material 2 which is comprised between the two electrodes 5. When the electrodes have simple shapes, as represented in FIG. 13, the semiconductor area is delineated by the facing surfaces of electrodes 5 and fictitious lines joining the ends of these two facing surfaces.

In FIG. 14, semiconductor material 2 does not cover and is not covered by source and drain electrodes 5. This embodiment is similar to that illustrated in FIG. 5. In this case, inter-electrode surface 2a (represented in hatched lines) corresponds only to the surface occupied by the area of semiconductor material 2 that is comprised between the two electrodes 5.

Inter-electrode surface 2a of semiconductor material 2 is a surface defined in a plane parallel to substrate 1, i.e. parallel to the surface of substrate 1 on which the different layers are deposited. This inter-electrode surface 2a of semiconductor material 2 is delineated by source and drain electrodes 5 as these electrodes are used to form the fictitious demarcation lines.

The invention claimed is:

1. A double-gate transistor comprising:
   a first gate electrode,
   a first gate dielectric,
   an organic semiconductor material,
   a second gate electrode,
   a second gate dielectric,
   source and drain electrodes delineating an inter-electrode surface of the semiconductor material,
   an electric charge trapping material arranged between the organic semi-conductor material and one of the gate electrodes and partially facing the inter-electrode surface, the trapping material being in physical contact with one of the gate electrodes or with the organic semiconductor material.

2. The device according to claim 1, wherein the electric charge trapping material comprises a portion of one of the gate dielectrics.

3. The device according to claim 1, wherein the electric charge trapping material comprises a portion of the organic semi-conductor material.

4. The device according to claim 1, wherein the electric charge trapping material is made from an ionic conductive polymer material.

5. The device according to claim 4, wherein the electric charge trapping material comprises a skeleton of poly(tetrafluoroethylene) type on which perfluorinated dangling chains terminated by sulfonic groups are grafted.

6. The device according to claim 1, comprising a plurality of elementary trapping areas made from the electric charge trapping material.

7. A method for producing a memory device successively comprising:
   forming a first gate electrode,
   forming a first gate dielectric,
   forming source and drain electrodes in contact with an organic semiconductor material, the source and drain electrodes defining an inter-electrode surface,
   forming a second gate dielectric,
   forming a second gate electrode,
   forming an electric charge trapping material between the organic semiconductor material and one of the gate electrodes, the electric charge trapping material being in physical contact with one of the gate electrodes or with the organic semiconductor material, the electric charge trapping material being partially facing the inter-electrode surface.

8. The method according to claim 7, wherein the electric charge trapping material is formed by decomposition of a portion of the first gate dielectric.

9. The method according to claim 7, wherein the electric charge trapping material is formed by decomposition of a portion of the organic semi-conductor material.

10. The method according to claim 8, wherein the electric charge trapping material is formed during patterning of the source and drain electrodes.

11. The method according to claim 8, wherein the electric charge trapping material is formed by physical, chemical, laser or plasma treatment.

12. The device according to claim 1, wherein the trapping material is in physical contact with one of the gate electrodes.

13. The device according to claim 1, wherein the trapping material is in physical contact with the organic semiconductor material.

* * * * *